United States Patent [19]

Fermier et al.

[11] Patent Number: 5,299,087
[45] Date of Patent: Mar. 29, 1994

[54] OVERLOAD PROTECTION CIRCUIT

[75] Inventors: Yvan Fermier, Vidauban; Michel Ferry, Vallauris; Christian Jacquart, Gattieres; Pierre Vachee, La Gaude, all of France

[73] Assignee: International Business Machines Corporation, Armonk, N.Y.

[21] Appl. No.: 731,593

[22] Filed: Jul. 17, 1991

[30] Foreign Application Priority Data

Aug. 29, 1990 [EP] European Pat. Off. ........ 90480130.5

[51] Int. Cl.$^5$ .................................. H02H 3/093
[52] U.S. Cl. ............................ 361/93; 361/98; 361/97; 361/87
[58] Field of Search ............... 361/87, 93, 98, 56, 361/29, 30, 97, 72

[56] References Cited

U.S. PATENT DOCUMENTS

| | | | |
|---|---|---|---|
| 4,241,372 | 12/1980 | Sears | 361/72 |
| 4,494,162 | 1/1985 | Eyler | 361/29 |
| 4,849,850 | 7/1989 | Brahms | 361/93 |
| 4,977,477 | 12/1990 | Babico et al. | 361/98 |

FOREIGN PATENT DOCUMENTS

| | | | |
|---|---|---|---|
| 2128405 | 6/1971 | Fed. Rep. of Germany | H02H 3/04 |
| 3421520 | 8/1984 | Fed. Rep. of Germany | H02H 7/12 |

Primary Examiner—A. D. Pellinen
Assistant Examiner—S. Jackson
Attorney, Agent, or Firm—Joscelyn G. Cockburn

[57] ABSTRACT

The overload protection circuit 12 comprises a resistor bridge 20 with a low impedance sensing resistor r and high impedance resistors R1 to R4 which generates voltages Va and Vb at the inputs 32 and 34 of a comparator 22. Voltage Vb depend upon the value of the load current so that the comparator provides at its output 36 a control signal for opening the switching device 24 comprising a field effect transistor when the load current exceeds a maximum value. Resistor R5 reinforces the effect of the control signal. This circuit can be used in a system which comprises a central power supply unit 8 which powers a plurality of devices such as 4. The status of the circuit 12 is reported to the system 8 though line 14 and circuit 12 comprises a control circuit 26 which is responsive to set and reset control signals on lines 14 and 18 from the unit 8 to close or open the switch 26.

2 Claims, 3 Drawing Sheets

OVERLOAD PROTECTION CIRCUIT

DESCRIPTION OF THE INVENTION

The subject invention relates to an overload protection circuit and more particularly to such a circuit which can be used for protecting devices powered from a unique remote unit.

BACKGROUND ART

Electronic circuits for protecting devices against overloads due to short circuits or any type of defaults already exist on the shelves, but none of them present a negligible resistance when in set status (closed) as a result; they can not be used to protect devices powered from a unique remote unit because the resistance induces power losses which are detrimental to the operation of the remote devices.

Mechanical overload protection circuits exist and might be appropriate in such an environment but these circuits are cumbersome and cannot be integrated within a VLSI chip.

In addition there is a requirement at the remote powering unit to be aware of the status of the overload protection circuit in any device in order to take appropriate actions depending upon the reported status.

SUMMARY OF THE INVENTION

Consequently, an object of the invention is to provide an overload protection circuit which presents a negligible resistance.

Another object of the invention is to provide such an overload protection circuit which is simple and can be easily integrated in a chip.

Another object of the invention is to provide such an overload protection circuit which is able to report its status to a remote unit and to be set or reset under control of this unit.

The overload protection circuit according to the present invention is used for protecting a device powered from a power supply unit which provides a supply voltage and a load current to the device. It comprises:
  an overload detecting circuit which includes:
    a resistor bridge having two legs connected in parallel between the supply voltage and a reference voltage (ground) and a first and second output terminals, and generating a fixed voltage on the first output terminal and a variable voltage which depends upon the load current value on the second output terminal,
    a comparator having first and second inputs connected to the first and second output terminals of the resistor bridge, respectively and an output, said comparator providing on its output a control signal which indicates whether an overload condition exists or not,
  a switch having an input receiving the load current, an output connected to the device and a control input responsive to the control signal for closing or opening said switch, whereby the load current is provided to the device or not. In a preferred embodiment of the invention the switch comprises a field effect transistor the first electrode of which receives the load current, the second electrode of which is connected to the device and the gate electrode of which is connected to the output of the comparator.

The type of the field effect transistor depends upon the polarity of the supply voltage, if it is positive the field effect transistor is of the P enhancement type and if it is negative the field effect transistor is of the N enhancement type.

According to another characteristic of the present invention a feedback resistor is connected between the output of the switch and the second output terminal of the resistor bridge to reinforce the effect of the control signal on the closing and opening of the switch.

According to a further characteristic of the present invention the output signal at the output of the comparator is indicative of the status of the switch and is reported to the power supply unit.

In addition, the protection circuit can be used for protecting a device which is powered from a power supply unit which comprises a first and a second control lines and provides on these lines switching control signals for closing and opening the switch, respectively. The overload protection circuit comprises a switching control circuit connected to the first and second control lines and responsive to the switching control signals on these lines to provide control voltages to the first and second inputs of the comparator, whereby the comparator generates closing or opening control signals on the control input of the switch. The overload protection circuit according to the subject invention can be implemented in a system comprising a central power supply unit which powers a plurality of devices, wherein each device is protected against overloads by an overload protection circuit so that an overload in any one of the devices does not impair the operation of the other devices.

DETAILED DESCRIPTION OF THE INVENTION

Figure 1:
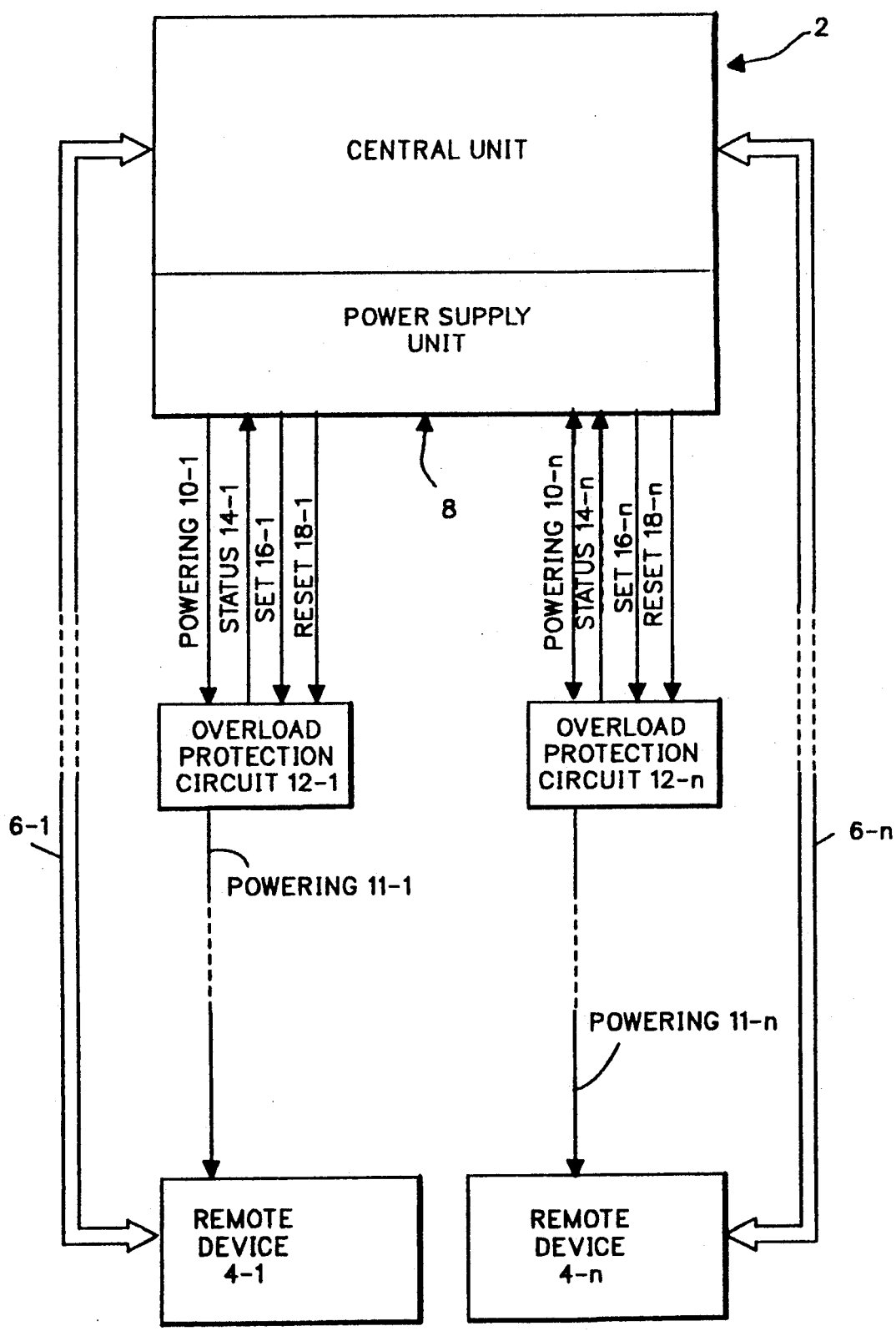
FIG. 1 represents the block diagram of a system wherein the circuit according to the present invention can be implemented.

FIG. 1 represents a system incorporating overload protection circuits according to the subject invention. This system is only shown for the, sake of illustration and it will be obvious to the person skilled in the art to implement the overload protection circuit in any other system from the description of the overload protection circuit.

The system shown in FIG. 1 comprises a central unit 2, which can be any type of information processing unit or any other central control unit attached to remote devices 4-1 to 4-n through busses 6-1 to 6-n respectively. Busses 6-1 to 6-n carry the control and information signals which are used for the operation of the remote devices, these signals are specific to the system and do not interact with the operation of the overload protection circuit of the present invention.

The remote devices 4-1 to 4-n do not have their own power supply and are powered from the central power supply unit 8.

Each remote devices 4-1 to 6-n is powered from the power supply unit 8 through lines 10-1 to 10-n respectively. An overload protection circuit 12-1 to 12-n respectively, is associated to each remote device 4-1 to 4-n, to protect the device against overcurrents due to short circuits or any other failures. For example, the overload protection circuit 12-1 for device 4-1 is connected to line 10-1 and prevents the remote devices 4-1 from being powered through line 11-1 if it detects an overcurrent due to a short circuit and it reports its status to the power supply system through line 14-1. The overload protection circuits can be set or reset by the power supply unit through lines 16-1 and 18-1.

The powering lines 11-1 to 11-n from circuits 12-1 to 12-n to remote devices 4-1 to 4-n are partly dotted in FIG. 1 to symbolize the fact that they can be quite long, more than 100 meters.

In another implementation, the overload protection circuits 12-1 to 12-n can be close to the remote devices 4-1 to 4-n and lines 10, 14, 16, 18 can be quite long, and the provision of an overload protection circuit associated to each device allows the operation of the system not to be disturbed by an overload due to a short circuit in any device, since when a short circuit occurs in one device, the device is isolated from the other ones, from a power standpoint.

Figure 2:
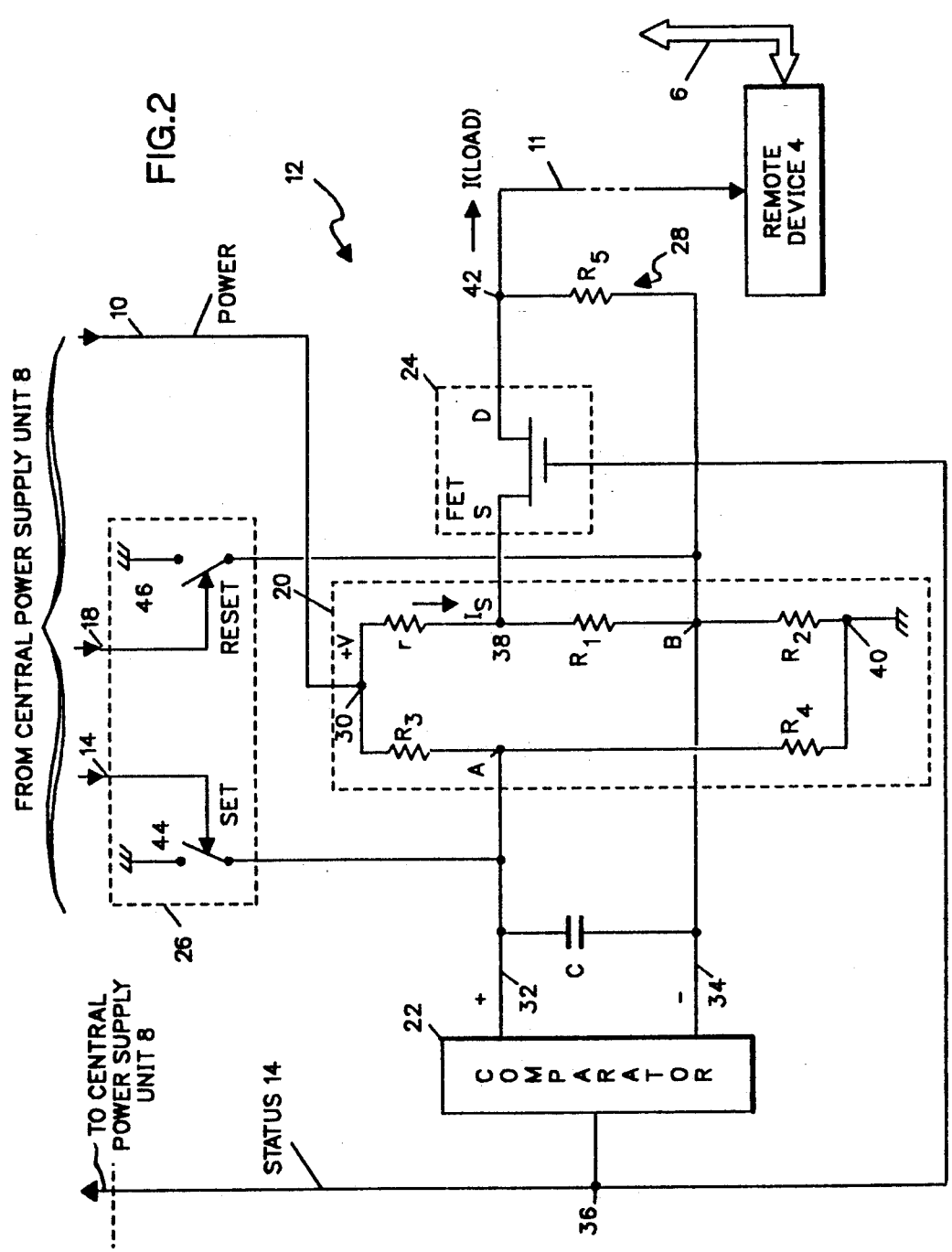
FIG. 2 represents a detailed schematic of the circuit according to the present invention when the supply voltage is positive.

The overload protection circuit 12 for any device 4, according to the subject invention is shown in FIG. 2.

Its major components are a resistor bridge 20, a comparator 22, a switch 24, a control circuit 26 and a feedback path 28.

The power supply system 8 generates at node 30 in the resistor bridge a voltage V. In the implementation shown in FIG. 2, the voltage V is positive.

One leg of the resistor bridge 20 comprises a low value sensing resistor r in series with resistors R1 and R2 and the other leg comprises resistor R3 and R4. Resistor r, R1 and R2 in the first leg are serially mounted between node 40 and node 30 which is connected to the ground.

Resistors R3 and R4 in the second leg are serially mounted between nodes 30 and 40.

The common point A of resistors R3 and R4 is connected to the plus input 32 of comparator 22 and the common point B of resistors R1 and R2 is connected to the minus input 34 of comparator 22.

The signal which is generated at the output of comparator 22 as will be described later on, is provided to the switch 24 in order to control its status, thus the status of the overload protection circuit is indicated by the signal at the output of comparator 22 which is connected to STATUS line 14.

In a preferred embodiment of the invention, the switch comprises a field effect transistor FET which presents a very low resistance when closed. In the circuit of FIG. 2, the transistor FET is of the P enhancement type. The source connected to the common part 38 between resistor r and resistor R4, the drain is connected to node 42 which is connected to the remote device 4. When the switch is closed a current I (load) is provided by overload protection circuit to the remote device 4 which is thus powered.

The feedback path comprises resistor R5 which is connected between node 42 and node B.

The control circuit 26 comprises two switches 44 and 46 which are operated by signals provided by the power supply unit 8 through, lines 14 and 18 to respectively set and reset the overload protection circuit, as will be described later on.

The circuit shown in FIG. 2 operates as follows.

Resistor r is a sensing resistor which has a low value. The supply current I (load) depends upon the supply voltage +V and the load in the remote device.

The resistor bridge generates a fixed voltage which is derived from +V at node A and a variable voltage which is derived from +V-rIs, where Is is the current in sensing resistor at node B.

The resistances of resistors R1, R2, R3 and R4 are chosen in order that when I (load)=0, the voltage Va at node A is higher than the voltage Vb at node B, which causes the comparator to provide an output signal to switch OFF the field effect transistor 24.

The field effect transistor 24 is switched ON through the power supply unit 8 which provides a SET signal on line 14 to close switch 44. Thus, voltage Va is lower than voltage Vb, and comparator 22 provides a zero level signal on its output 36, which switches ON field effect transistor 24.

When field effect transistor 24 is switched ON, resistor R5 is parallely mounted with resistor R1.

As long as Is remains lower than a threshold current It, Va is lower than Vb and the field effect transistor remains ON, When Is becomes higher than It, Va becomes higher than Vb and the field effect transistor switches OFF, and the remote device is protected against the overcurrents higher than It.

Due to the feedback path arrangement comprising the resistor R5, when the field effect transistor 24 is switched ON, voltage Vb decreases and when the field effect transistor is switched OFF, voltage Vb increases. This results in an hysteresis effect which reinforces the control effect of the sense current Is upon the switching ON and OFF of the field effect transistor.

Note that feedback resistor could be implemented differently, for example, between FET gate and input A.

Consequently, the sensing resistor can have a low value. In a preferred embodiment of the invention the resistors have the following values:

R1=54.9 Kiloohms
R2=R3=R4=49.9 Kiloohms
R5=274 Kiloohms
r=1.6 ohms

The capacitor C connected across A and B prevents the overload protection circuit from being sensitive to transient overload conditions. Other locations for capacitor C will provide unequal switch on and switch off same constants.

The functions of switches 44 and 46 can be implemented by any type of switching devices, such as field effect transistors or bipolar transistors. In a preferred embodiment of the invention this function is performed by TTL open-collector gates.

Figure 3:
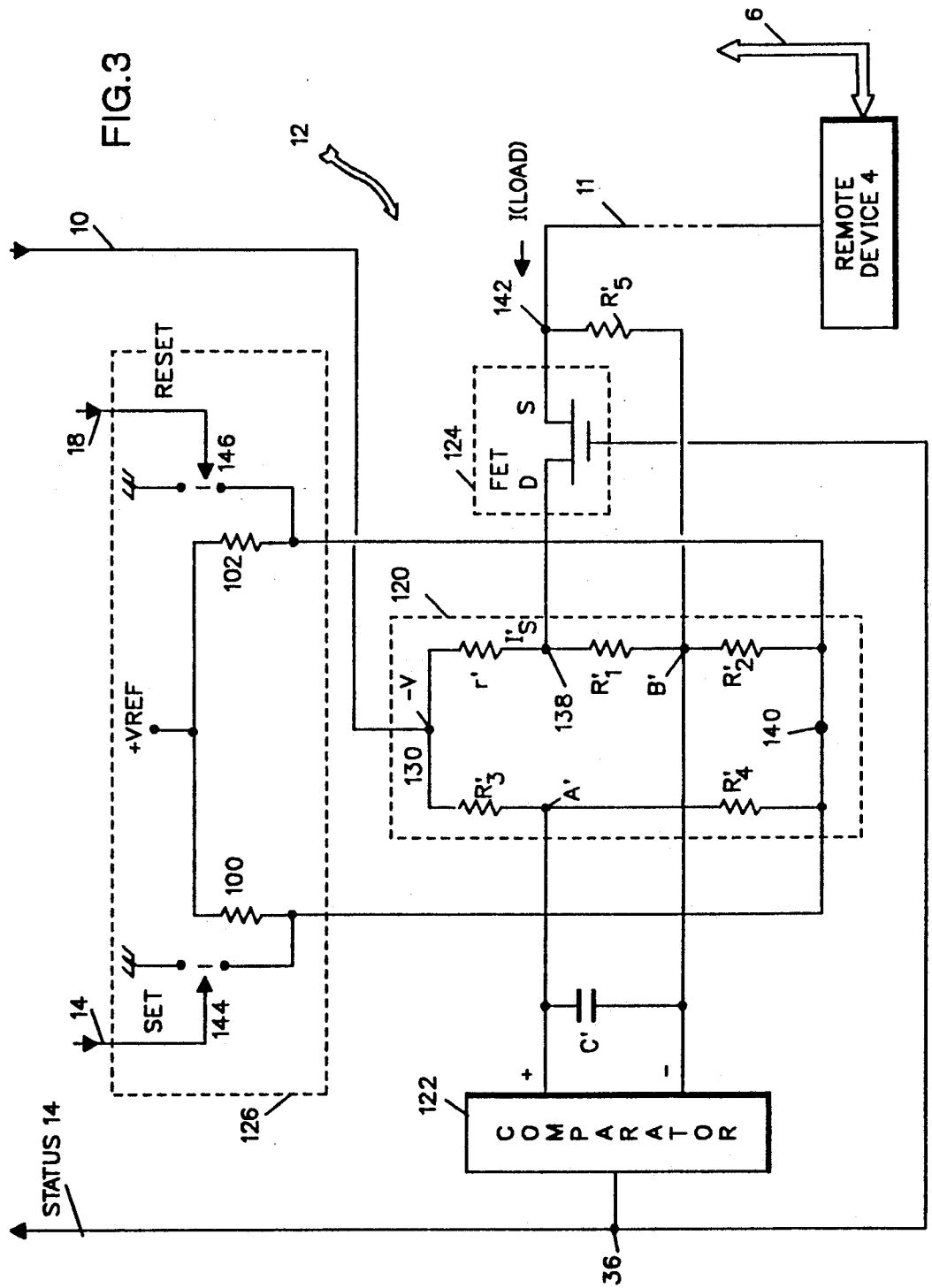
FIG. 3 represents a detailed schematic of the circuit according to the present invention when the supply voltage is negative.

FIG. 3 represents the overload protection circuit when implemented to protect a remote device operating with a negative supply voltage −V. The components of this circuit are referenced by the reference numbers of FIG. 2 added to 100, i.e. switch 124 in FIG. 3 has the same function as switch 24 in FIG. 2. In that implementation, switch 124 comprises a FET transistor of the N enhancement type.

The resistors and capacitor in FIG. 3 have the same references as in FIG. 2 with a prime sign.

The operation of circuit of FIG. 3 is similar to the operation of the circuit of FIG. 2, so that it is not described again.

Only the operation of the control circuit 126 is different. Both switches 144 and 146 are closed in normal operation mode. They are open one at a time to set or reset the circuit which causes the voltages at node A' or B' to be changed by means of resistors 100 and 102 connected between a positive reference voltage +Vref and node 140.

We claim:

1. An overload protection circuit for protecting a device (4) powered from a power supply means (8) providing to the device a supply voltage (V) and a load current I (load), characterized in that it comprises:

overload detecting means (20,22) including:

a resistor bridge (20) having two legs connected in parallel between the supply voltage and a reference voltage (ground) and a first and second output terminals, and generating a fixed voltage on the first output terminal (A) and a variable voltage which depends upon the load current value on the second output terminal (B);

a comparator (22) having first and second inputs connected to the first and second output terminals of the resistor bridge, respectively and an output, said comparator providing on its output a control signal which indicates whether an overload condition exists or not;

switching means (24) having an input receiving the load current, an output connected to the device and a control input responsive to the control signal on the output of the comparator for closing or opening the switching means, whereby the load current is provided to the device or not; and a switching control means (26) coupled to the comparator; said switching control means (26) responsive to control signals, at its input, to provide to the first and second inputs of the comparator control voltages which cause the comparator to generate closing or opening control signals on the control input of the switching means.

2. The overload protection circuit according to claim 1 wherein the switching control means (26) includes a first switch circuit having first input control line (14) for receiving a first control signal and a first output line for generating an output signal in response to the first control signal; and a second switch circuit having a second input control line (18) for receiving a second control signal and a second output line for generating an output signal in response to the second control signal.

* * * * *